(12) United States Patent
Wang et al.

(10) Patent No.: US 11,955,168 B2
(45) Date of Patent: Apr. 9, 2024

(54) MEMORY DEVICE AND COMPUTING METHOD USING THE SAME

(71) Applicant: MACRONIX INTERNATIONAL CO., LTD., Hsinchu (TW)

(72) Inventors: Yun-Yuan Wang, Kaohsiung (TW); Ming-Hsiu Lee, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 120 days.

(21) Appl. No.: 17/819,370

(22) Filed: Aug. 12, 2022

(65) Prior Publication Data

US 2023/0368836 A1    Nov. 16, 2023

Related U.S. Application Data

(60) Provisional application No. 63/340,895, filed on May 11, 2022.

(51) Int. Cl.
| | | |
|---|---|---|
| G11C 11/40 | (2006.01) | |
| G11C 11/408 | (2006.01) | |
| G11C 11/4094 | (2006.01) | |
| G11C 11/4096 | (2006.01) | |

(52) U.S. Cl.
CPC ...... *G11C 11/4096* (2013.01); *G11C 11/4085* (2013.01); *G11C 11/4094* (2013.01)

(58) Field of Classification Search
None
See application file for complete search history.

(56) References Cited

U.S. PATENT DOCUMENTS

| | | | | |
|---|---|---|---|---|
| 7,864,596 B2* | 1/2011 | Parker | ............... | G11C 16/3477 |
| | | | | 365/82 |
| 11,756,615 B2* | 9/2023 | Carissimi | ............... | G11C 7/12 |
| | | | | 365/163 |
| 2003/0053329 A1* | 3/2003 | Chen | ............... | G11C 8/10 |
| | | | | 365/149 |
| 2011/0063902 A1* | 3/2011 | Lung | ............... | G11C 7/1045 |
| | | | | 365/163 |
| 2012/0176841 A1* | 7/2012 | Lee | ............... | G11C 16/10 |
| | | | | 365/185.17 |
| 2014/0140139 A1* | 5/2014 | Wang | ............... | G11C 16/0441 |
| | | | | 365/185.18 |
| 2023/0326499 A1* | 10/2023 | Pasotti | ............... | G11C 7/1063 |
| | | | | 365/191 |

\* cited by examiner

*Primary Examiner* — Tan T. Nguyen
(74) *Attorney, Agent, or Firm* — McClure, Qualey & Rodack, LLP

(57) ABSTRACT

A memory device is provided. The memory device includes a memory array of a plurality of memory elements, a plurality of word lines or word line pairs, a plurality of bit line pairs, and a plurality of common source lines. Each of the memory elements includes two memory cells. The memory device is configured for calculating an energy value based on a plurality of state signals and a plurality of coefficients, and the two memory cells of each of the memory elements are configured for performing an individual selection such that one of the two memory cells of each of the memory elements receives two corresponding state signals from a corresponding word line or a corresponding word line pair and a corresponding bit line pair and generates an output current into a corresponding common source line for calculating the energy value.

20 Claims, 10 Drawing Sheets

MEMORY DEVICE AND COMPUTING METHOD USING THE SAME

This application claims the benefit of U.S. provisional application Ser. No. 63/340,895, filed May 11, 2022, the subject matter of which is incorporated herein by reference.

TECHNICAL FIELD

This disclosure relates to a semiconductor device and a computing method using the same. More particularly, this disclosure relates to a memory device and a computing method using the same.

BACKGROUND

Optimization problems have been researched for a long time, and various solutions have been developed, such as Monte Carlo method, simulated annealing, quantum annealing, genetic algorithm, tabu search, neural network, and so on. The algorithms may be inspired by natural phenomena. For example, annealing is a thermal treatment typically used in material related fields, which involves heating a material to a temperature high enough, maintaining at the temperature for an appropriate period of time, and then cooling. At the high temperature, atoms in the material obtain energy to migrate in the lattice. As the temperature decreases, the atoms slow down and rearrange to a new configuration having a lower energy. Correspondingly, in an algorithm inspired by annealing, the "temperature" may progressively decrease as time goes by, and at each time cycle, the algorithm may randomly select a new configuration close to the current one, compare their energy values, and stand or move to the new configuration according to a predetermined criteria. However, as the number of state signals in each configuration increases, the computation becomes more complex and difficult to perform.

SUMMARY

This disclosure is focused on improved implementations provided for algorithms, including a device used for the computation and a computing method.

According to some embodiments, a memory device is provided. The memory device comprises a memory array of a plurality of memory elements, a plurality of word lines or a plurality of word line pairs, a plurality of bit line pairs, and a plurality of common source lines. Each of the memory elements comprises two memory cells. The word lines or the word line pairs are connected to rows of the memory array. The bit line pairs are connected to columns of the memory array. The common source lines are connected to the columns of the memory array. The memory device is configured for calculating an energy value based on a plurality of state signals and a plurality of coefficients, and the two memory cells of each of the memory elements are configured for performing an individual selection such that one of the two memory cells of each of the memory elements receives two corresponding state signals from a corresponding word line or a corresponding word line pair and a corresponding bit line pair and generates an output current into a corresponding common source line for calculating the energy value.

According to some embodiments, a computing method is provided. The computing method calculating an energy value based on a plurality of state signals and a plurality of coefficients. The computing method uses a memory device. The memory device comprises a memory array of a plurality of memory elements. Each of the memory elements comprises two memory cells. The computing method comprises: setting up the state signals in the memory array, comprising: conducting a complementary read operation for individually selecting one of the two memory cells of each of the memory elements for receiving two corresponding state signals; and inputting the state signals into the selected memory cells of the memory elements, wherein the selected memory cells generates a plurality of output currents; and calculating the energy value corresponding to the state signals based on a sum value of the output currents.

Figure 1A:
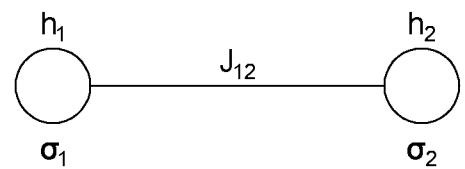
FIGS. 1A-1B illustrate Ising model.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The description and the drawings are provided for illustrative only, and not intended to result in a limitation. For clarity, the elements may not be drawn to scale. In addition, some elements and/or reference numerals may be omitted from some drawings. It is contemplated that the elements and features of one embodiment can be beneficially incorporated in another embodiment without further recitation.

Figure 1B:
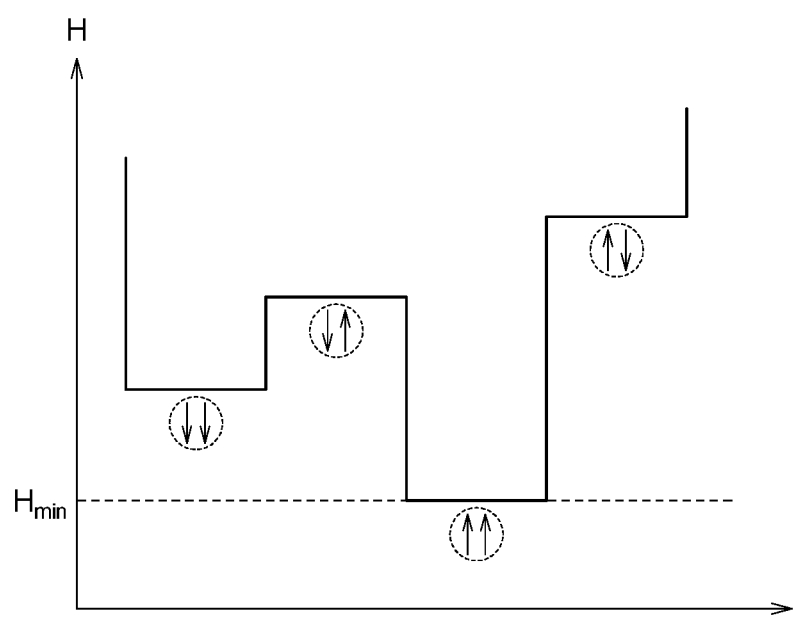

Referring to FIGS. 1A-1B, Ising model is illustrated. Ising model can describe the energy of a magnetic material with particular "spins". FIG. 1A shows a simplest Ising model. This model comprises two sites having state signals $\sigma_1$ and $\sigma_2$, respectively. The state signals $\sigma_1$ and $\sigma_2$ correspond to spins of sites independently selected from +1 (i.e., spin in a positive direction, typically represented by an upward arrow) and −1 (i.e., spin in a negative direction, typically represented by a downward arrow). For each site, the effect of external magnetic field interacting with the site is represented by a self coefficient $h_1$ or $h_2$ representing. In addition, the interaction between the sites is represented by an interaction coefficient $J_{12}$. As such, the energy H of the configuration may be represented by formula (1).

$$H = h_1\sigma_1 + h_2\sigma_2 + J_{12}\sigma_1\sigma_2 \tag{1}$$

According to formula (1), energy H may be computed for different configurations of the state signals $\sigma_1$ and $\Sigma_2$ (i.e., $\sigma_1=-1$ and $\sigma_2=-1$, $\sigma_1=-1$ and $\sigma_2=+1$, $\sigma_1=+1$ and $\sigma_2=+1$, and $\sigma_1=+1$ and $\sigma_2=-1$). For example, given $h_1=0.1$, $h_2=-0.2$, and $J_{12}=-0.3$, the minimum energy $H_{min}$ will be obtained when both of $\sigma_1$ and $\sigma_2$ are +1, as shown in FIG. 1B. At this time, the Ising model system has an optimal solution. In other words, if an optimization problem corresponds to these conditions, its solution is the configuration in which $\sigma_1=-1$ and $\sigma_2=+1$.

Figure 2:
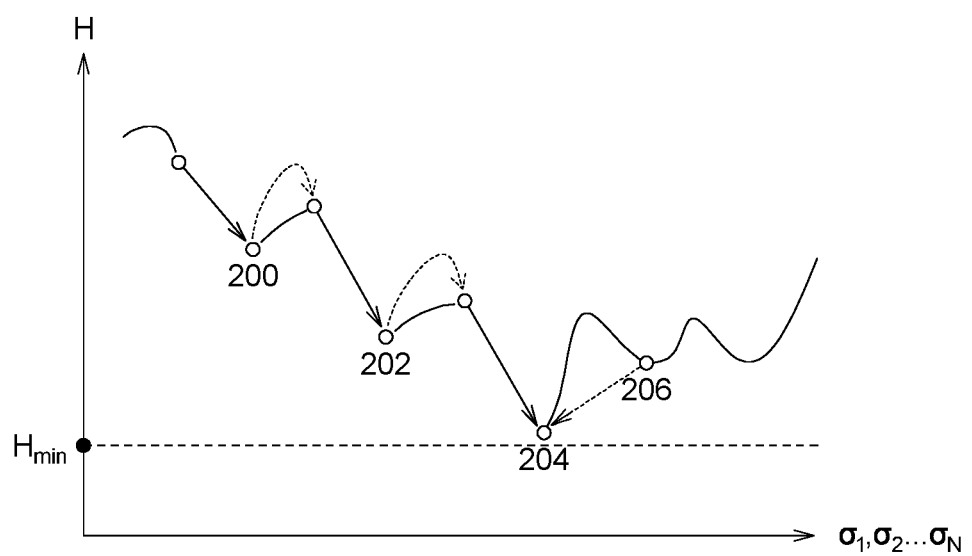
FIG. 2 illustrates annealing algorithms.

FIG. 2 illustrates annealing algorithms. There are N state signals $\sigma_1, \sigma_2 \ldots \sigma_N$ in each of configurations 200, 202, 204, and 206. In a path corresponding to simulated annealing algorithm, a temporary solution is the configuration 200 having a local minimum energy, with thermal fluctuations, the state signals are updated to the configuration 202, and finally to the configuration 204 having the minimum energy $H_{min}$ in all configurations. In a path corresponding to quantum annealing algorithm, a temporary solution is the configuration 206 having a local minimum energy, and with quantum tunneling, the state signals are updated to the configuration 204 having the minimum energy $H_{min}$ in all configurations.

The disclosure provides a memory device, which can be used for computation of the algorithm. The memory device comprises a memory array of a plurality of memory elements, a plurality of word lines or a plurality of word line pairs, a plurality of bit line pairs, and a plurality of common source lines. Each of the memory elements comprises two memory cells. The word lines or the word line pairs are connected to rows of the memory array. The bit line pairs are connected to columns of the memory array. The common source lines are connected to the columns of the memory array. The memory device is configured for calculating an energy value based on a plurality of state signals and a plurality of coefficients, and the two memory cells of each of the memory elements are configured for performing an individual selection such that one of the two memory cells of each of the memory elements receives two corresponding state signals from a corresponding word line or a corresponding word line pair and a corresponding bit line pair and generates an output current into a corresponding common source line for calculating the energy value.

Figure 3:
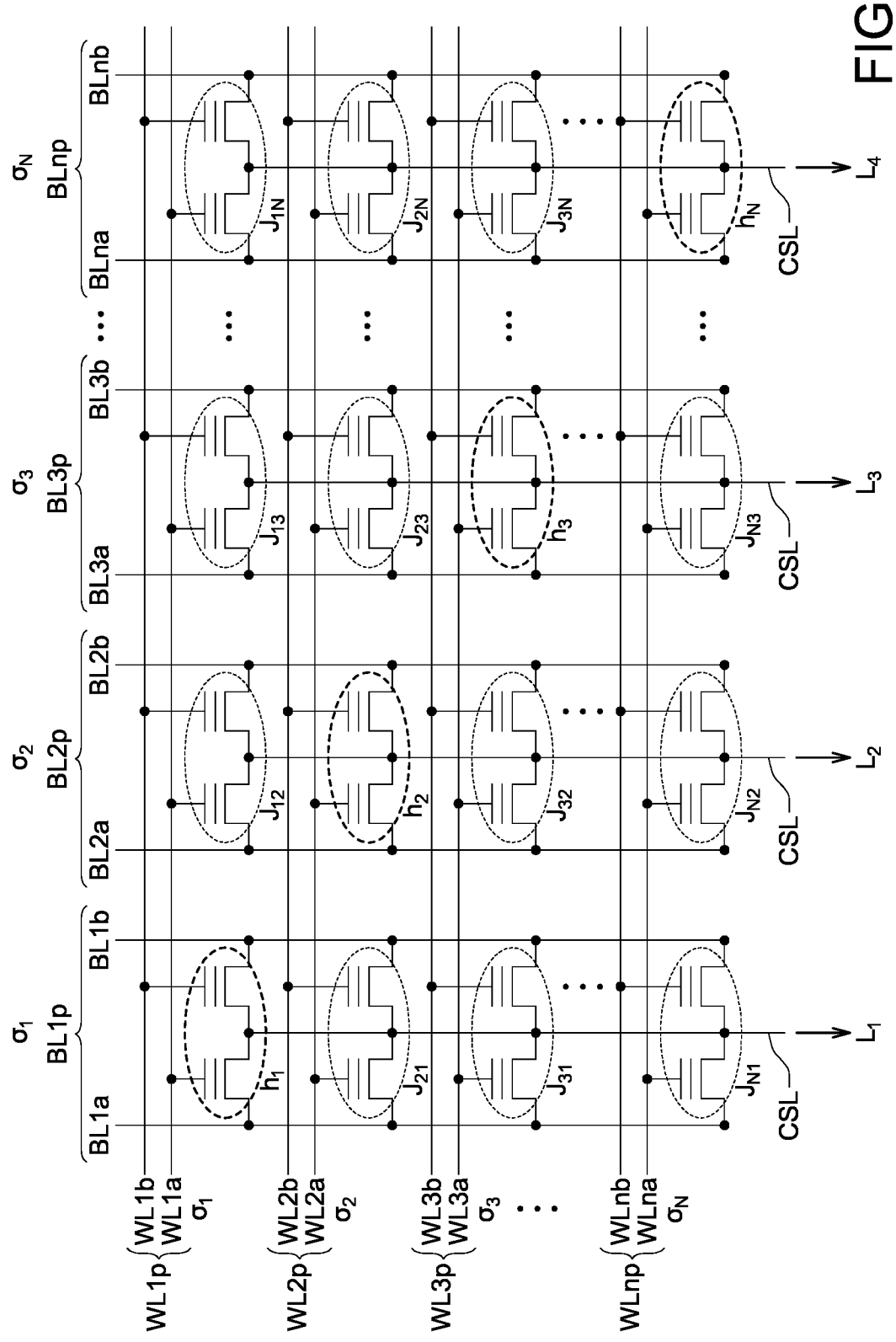
FIG. 3 illustrates a memory device according to the disclosure.

FIG. 3 illustrates an exemplary memory according to the disclosure. The memory device comprises a memory array of a plurality of memory elements M, a plurality of word line pairs WL1p . . . WLnp, a plurality of bit line pairs BL1p . . . BLnp and a plurality of common source lines CSL. The word line pairs WL1p . . . WLnp are connected to rows of the memory array. The word line pairs WL1p . . . WLnp comprise first word lines WL1a . . . WLna and second word lines WL1b . . . WLnb, wherein the word line pair WL1p comprise the paired first and second word lines WL1a and WL1b, the word line pair WL2p comprise the paired first and second word lines WL2a and WL2b, and so on. The word line pairs WL1p . . . WLnp are configured for receiving state signals $\sigma_1 \ldots \sigma_N$, respectively. The bit line pairs BL1p . . . BLnp are connected to columns of the memory array. The bit line pairs BL1p . . . BLnp comprise first bit lines BL1a . . . BLna and second bit lines BL1b . . . BLnb, wherein the bit line pair BL1p comprise the paired first and second bit lines BL1a and BL1b, the bit line pair BL2p comprise the paired first and second bit lines BL2a and BL2b, and so on. The bit line pairs BL1p . . . BLnp are configured for receiving state signals $\sigma_1 \ldots \sigma_N$, respectively. The common source lines CSL are connected to the columns of the memory array.

Figure 4:
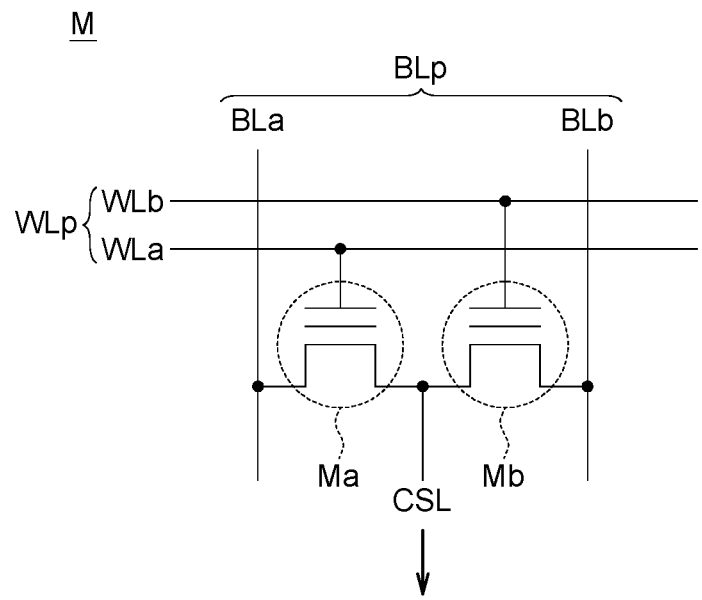
FIGS. 4-9 illustrate various exemplary memory elements which may be used in a memory device according to the disclosure.

Referring to FIG. 4, an exemplary memory element M for the memory array shown in FIG. 3 is illustrated. Each of the memory elements M comprises two memory cells Ma and Mb. One of the two memory cells Ma and Mb is coupled to a word line of the corresponding word line pair WLp, a bit line of the corresponding bit line pair BLp, and the corresponding common source line CSL, and the other one of the two memory cells Ma and Mb is coupled to the other word line of the corresponding word line pair WLp, the other bit line of the corresponding bit line pair BLp, and the corresponding common source line CSL. For example, the memory cell Ma is coupled to the first word line WLa, the first bit line BLa, and the corresponding common source line CSL, and the memory cell Mb is coupled to the second word line WLb, the second bit line BLb, and the corresponding common source line CSL. In FIG. 4, the memory element M is illustrated as a 2T floating gate device. Each of the memory cells Ma and Mb comprises a transistor, and the two transistors are of same type, such as n-type. Each of the memory cells Ma and Mb may have a tunable threshold voltage. Each of the memory cells Ma and Mb may be a floating gate cell, a charge trapping cells, a FeFET (ferroelectric field effect transistor) cell, or the like.

It is appreciated that various kinds of memory elements may be used in the memory array according to the disclosure with suitable modifications to the corresponding lines and layout. According to some embodiments, each of the memory cells may have a tunable threshold voltage or a tunable resistance. According to some embodiments, each of the memory cells may comprise a transistor or comprise a transistor and a resistor. According to some embodiments, each of the memory elements M may comprise two transistors of same type or two transistors of complementary type. According to some embodiments, each of the memory cells may be a floating gate cell, a charge trapping cells, a FeFET cell, a ReRAM (resistive random access memory) cell, a CBRAM (conductive bridge random access memory) cell, a PCM (phase change memory) cell, or a MRAM (magnetoresistive random access memory) cell, but not limited thereto.

Figure 5:
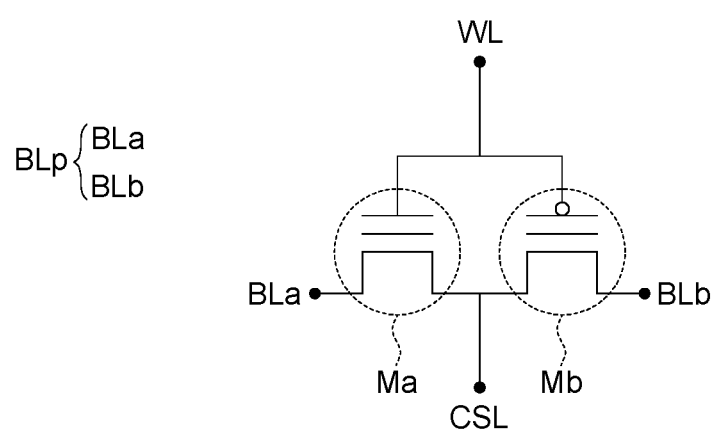

FIGS. 5-9 illustrate some other exemplary memory elements which may be used in a memory device according to the disclosure. In FIG. 5, the memory element M is illustrated to have an inverter-like structure. Each of the memory cells Ma and Mb comprises a transistor. The two transistors are of complementary type. The two memory cells Ma and Mb are coupled to the same word line WL. In other words, one of the two memory cells Ma is coupled to the corresponding word line WL, and the other one of the two memory cells Mb is coupled to the corresponding word line WL. It can be contemplated that the memory device will comprise a plurality of word lines rather than the word line pairs described above connected to the rows of the memory array. Each of the memory cells Ma and Mb may have a tunable threshold voltage. Each of the memory cells Ma and Mb may be a floating gate cell, a charge trapping cells, a FeFET cell, or the like.

Figure 6:
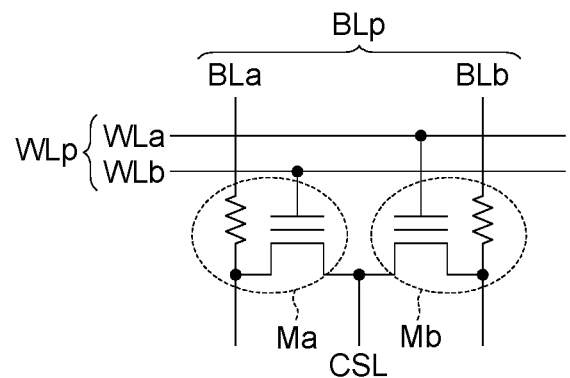

In FIG. 6, the memory element M is illustrated as a 2T2R device. Each of the memory cells Ma and Mb comprises a transistor and a resistor. The two transistors are of same type. The resistor is arranged between the transistor and the corresponding first or second bit line BLa or BLb. Each of the memory cells Ma and Mb may have a tunable resistance. Each of the memory cells Ma and Mb may be ReRAM cell, a CBRAM cell, a PCM cell, a MRAM cell, or the like.

Figure 7:
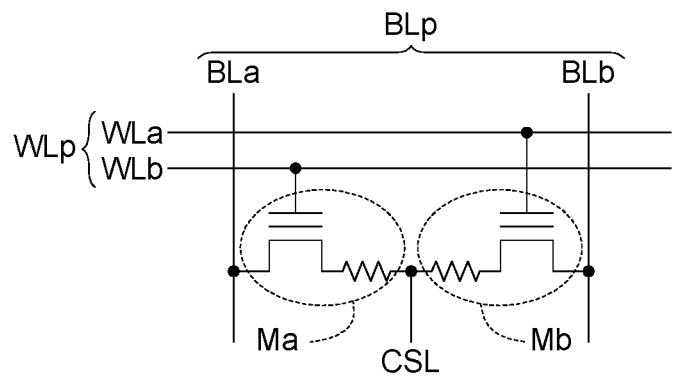

In FIG. 7, the memory element M is illustrated as a 2T2R device. Each of the memory cells Ma and Mb comprises a transistor and a resistor. The two transistors are of same type. The resistor is arranged between the transistor and the common source line CSL. Each of the memory cells Ma and Mb may have a tunable resistance. Each of the memory cells Ma and Mb may be ReRAM cell, a CBRAM cell, a PCM cell, a MRAM cell, or the like.

Figure 8:
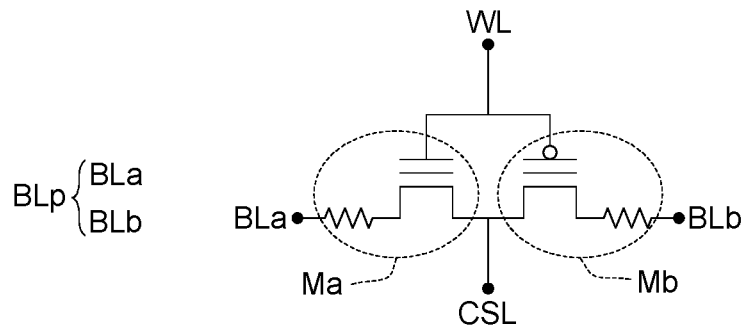

In FIG. 8, the memory element M is illustrated as a 2T2R device. Each of the memory cells Ma and Mb comprises a transistor and a resistor. The two transistors are of complementary type. The two memory cells Ma and Mb are coupled to the same word line WL. The resistor is arranged between the transistor and the corresponding first or second bit line BLa or BLb. Each of the memory cells Ma and Mb may have a tunable resistance. Each of the memory cells Ma and Mb may be ReRAM cell, a CBRAM cell, a PCM cell, a MRAM cell, or the like.

Figure 9:
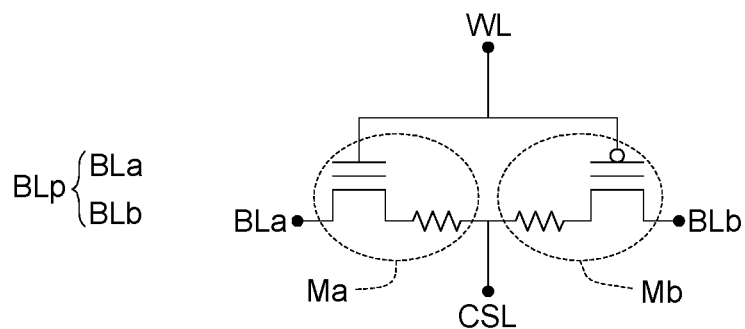

In FIG. 9, the memory element M is illustrated as a 2T2R device. Each of the memory cells Ma and Mb comprises a transistor and a resistor. The two transistors are of complementary type. The two memory cells Ma and Mb are coupled to the same word line WL. The resistor is arranged between the transistor and the common source line CSL. Each of the memory cells Ma and Mb may have a tunable resistance. Each of the memory cells Ma and Mb may be ReRAM cell, a CBRAM cell, a PCM cell, a MRAM cell, or the like.

Now referring to FIGS. 10A-10F as well as FIG. 3 and FIG. 4, the operations of the memory elements M will be provided more fully hereinafter with the exemplary structure as shown in FIGS. 3 and 4.

According to the disclosure, the memory device can be configured for calculating an energy value based on a plurality of state signals and a plurality of coefficients. The two memory cells Ma and Mb of each of the memory elements M are configured for performing an individual selection such that one of the memory cells Ma or Mb of each of the memory elements M receives two corresponding state signals from the corresponding word line pair WLp and the corresponding bit line pair BLp and generates an output current into a corresponding common source line CSL for calculating the energy value.

According to some embodiments, the memory elements M that are not arranged at a diagonal of the memory array may be used to compute the interaction term of the energy. Exemplary interaction coefficient $J_{12}$, $J_{13}$, $J_{1N}$, $J_{21}$, $J_{23}$, $J_{2N}$, $J_{31}$, $J_{32}$, $J_{3N}$, $J_{N1}$, $J_{N2}$, and $J_{N3}$ are shown in FIG. 3 at corresponding memory elements M. In such conditions, the two memory cells Ma and Mb of each of the memory elements M that is not arranged at a diagonal of the memory array may perform a logic "XNOR" operation, which may be represented by formula 2.

$$\sigma_i \text{XNOR} \sigma_j = (-\sigma_i) \text{XNOR} (-\sigma_j) \tag{2}$$

Figure 10A:
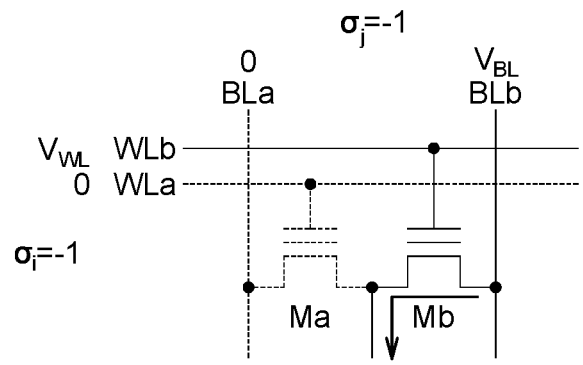
FIGS. 10A-10F illustrate various operations for one kind of exemplary memory elements according to the disclosure.
Figure 10B:
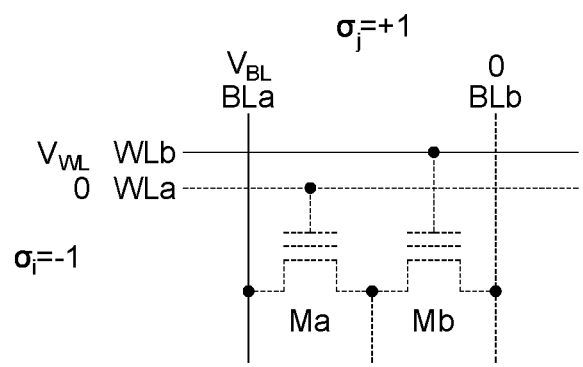
Figure 10C:
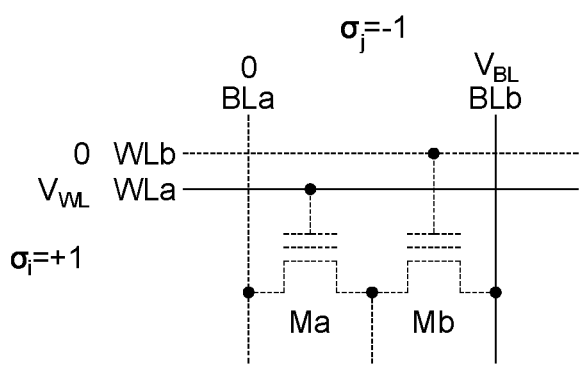
Figure 10D:
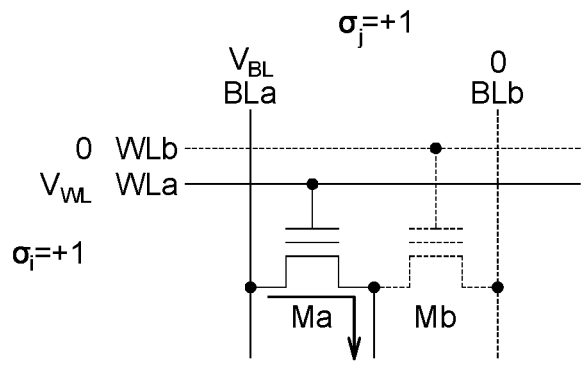

Specifically, as shown in FIG. 10A, when the state signal $\sigma_i$ is −1, a zero voltage is applied to the first word line WLa, and a word line voltage $V_{WL}$ is applied to the second word line WLb. When the state signal $\sigma_j$ is −1, a zero voltage is applied to the first bit line BLa, and a bit line voltage $V_{BL}$ is applied to the second bit line BLb. In such a condition, a current is output from the memory cell Mb, as indicated by the arrow shown in FIG. 10A. As shown in FIG. 10B, when the state signal $\sigma_i$ is −1, a zero voltage is applied to the first word line WLa, and a word line voltage $V_{WL}$ is applied to the second word line WLb. When the state signal $\sigma_j$ is +1, a bit line voltage $V_{BL}$ is applied to the first bit line BLa, and a zero voltage is applied to the second bit line BLb. In such a condition, no current is output from the memory element M. As shown in FIG. 10C, when the state signal $\sigma_i$ is +1, a word line voltage $V_{WL}$ is applied to the first word line WLa, and a zero voltage is applied to the second word line WLb. When the state signal $\sigma_j$ is −1, a zero voltage is applied to the first bit line BLa, and a bit line voltage VBA is applied to the second bit line BLb. In such a condition, no current is output from the memory element M. As shown in FIG. 10D, when the state signal $\sigma_i$ is +1, a word line voltage $V_{WL}$ is applied to the first word line WLa, and a zero voltage is applied to the second word line WLb. When the state signal $\sigma_j$ is +1, a bit line voltage VBA is applied to the first bit line BLa, and a zero voltage is applied to the second bit line BLb. In such a condition, a current is output from the memory cell Ma, as indicated by the arrow shown in FIG. 10D. The output current when both of $\sigma_i$ and a are −1 will equal to the output current when both of $\sigma_i$ and $\sigma_j$ are +1. The same output current IA may be represented by formula (3).

$$I_{Jij} \propto J_{ij} \cdot (\sigma_i \text{XNOR} \sigma_j) = J_{ij} \cdot \frac{1}{2}(\sigma_i \sigma_j + 1) \tag{3}$$

In some embodiments, the idle memory elements M that are arranged at a diagonal of the memory array may be used to compute the external field term of the energy. Exemplary self coefficient $h_1$, $h_2$, $h_3$, and $h_N$ are shown in FIG. 3 at corresponding memory elements M. In such conditions, the two memory cells Ma and Mb of each of the memory elements M that is arranged at a diagonal of the memory array may perform a logic "AND" operation.

Figure 10E:
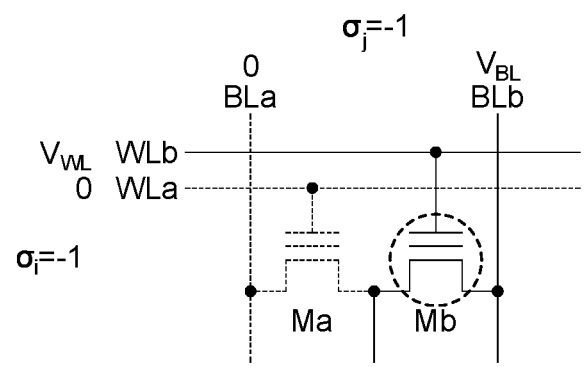
Figure 10F:
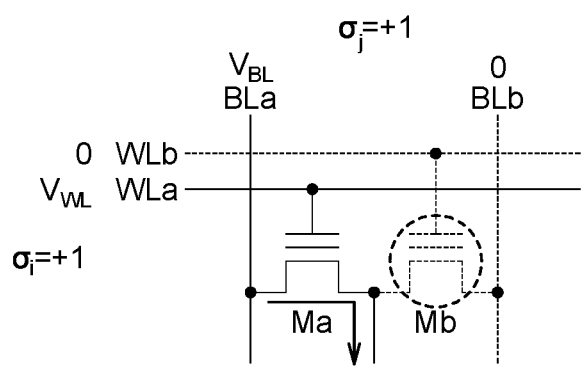

Specifically, as shown in FIG. 10E, when the state signal $\sigma_i$ is −1, a zero voltage is applied to the first word line WLa, and a word line voltage $V_{WL}$ is applied to the second word line WLb. When the state signal $\sigma_j$ is −1, a zero voltage is applied to the first bit line BLa, and a bit line voltage $V_{BL}$ is applied to the second bit line BLb. However, the memory cell Mb has been masked by a high threshold voltage previously. As such, no current is output from the memory element M. As shown in FIG. 10F, when the state signal $\sigma_i$ is +1, a word line voltage $V_{WL}$ is applied to the first word line WLa, and a zero voltage is applied to the second word line WLb. When the state signal $\sigma_j$ is +1, a bit line voltage $V_{BL}$ is applied to the first bit line BLa, and a zero voltage is applied to the second bit line BLb. In such a condition, a current is output from the memory cell Ma, as indicated by the arrow shown in FIG. 10F. The output current $I_h$ may be represented by formula (4).

$$I_h \propto h_i \cdot (\sigma_i \text{AND} \sigma_i) = h_i \cdot \frac{1}{2}(\sigma_i + 1) \tag{4}$$

In a memory element M as shown in FIG. 5, when the state signal $\sigma_i$ is +1, a word line voltage $V_{WL}$ is applied to the word line, and further to gate of the two transistors. When the state signal $\sigma_i$ is −1, a word line voltage $-V_{WL}$ is applied to the word line, and further to gate of the two transistors. When the state signal $\sigma_j$ is +1, a bit line voltage $V_{BL}$ and a zero voltage are applied to the first and second bit lines BLa and BLb, and further to the drains of the transistors of the memory cells Ma and Mb, respectively. When the state signal $\sigma_j$ is −1, a zero voltage and a bit line voltage $V_{BL}$ are applied to the first and second bit lines BLa and BLb, and further to the drains of the transistors of the memory cells Ma and Mb, respectively.

As described above, each of the memory elements M can couple the two state signal $\sigma_i$ and $\sigma_j$ from the corresponding word line pair WLp and bit line pair BLp, and provides a coupling result based on the encoding strategy of, for example, threshold voltage. It is beneficial to use the memory array for computation since the energies of spins can be calculated in a parallel manner.

Figure 11:
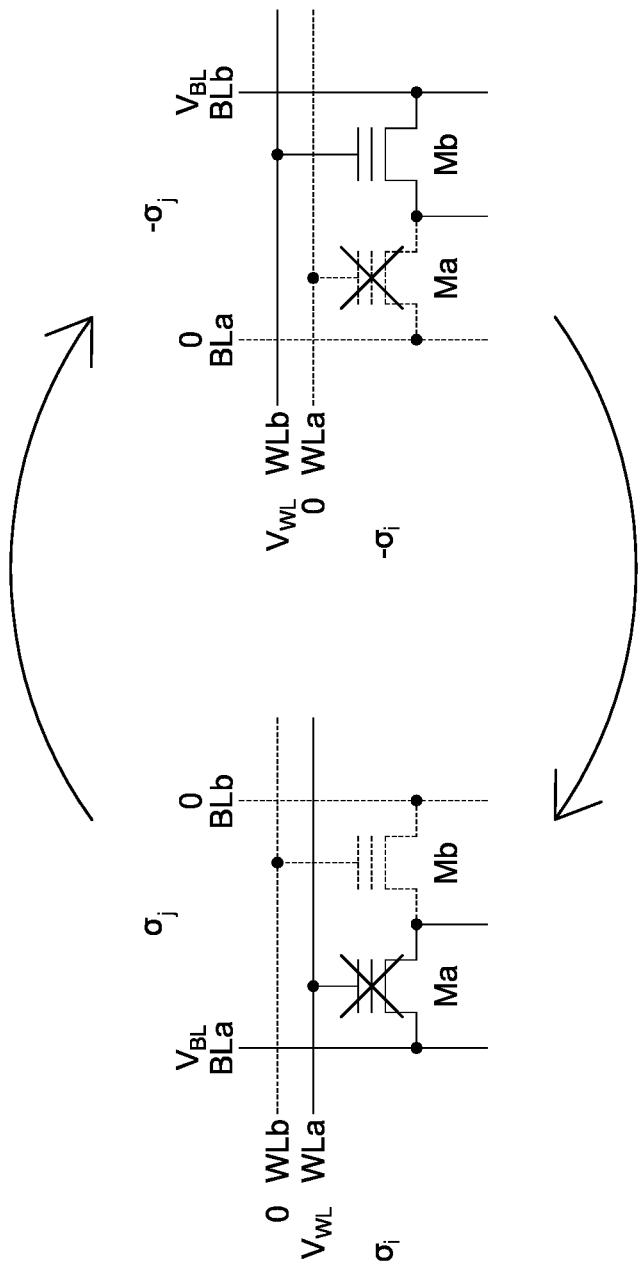
FIG. 11 illustrates a complementary read operation according to the disclosure.

As shown in FIG. 11, occasionally, one of the memory cells in the memory elements M, such as the memory cell Ma, is damaged. The individual selection for selecting one of the two memory cells to receive the two corresponding state signals for calculating the energy value can ensure that, at least in some cycles, the computation is conducted using the normal memory cell Mb, and thus will not be affected by the damaged memory cell Ma. As such, a larger standard deviation of the tunable threshold voltage or resistance can be tolerated in the memory device for the computation. The "flipping" between the two conditions as shown in FIG. 11 is somewhat analogous to the vibration of an atom on a lattice site. The details of such an operation will be provided more fully in following paragraphs with respect to the computing method.

The disclosure also provides a computing method. The computing method calculating an energy value based on a plurality of state signals and a plurality of coefficients. The computing method uses a memory device. The memory device comprises a memory array of a plurality of memory elements. Each of the memory elements comprises two memory cells. The computing method comprises: setting up the state signals in the memory array, comprising: conducting a complementary read operation for individually selecting one of the two memory cells of each of the memory elements for receiving two corresponding state signals; and inputting the state signals into the selected memory cells of the memory elements, wherein the selected memory cells generates a plurality of output currents; and calculating the energy value corresponding to the state signals based on a sum value of the output currents.

Figure 12:
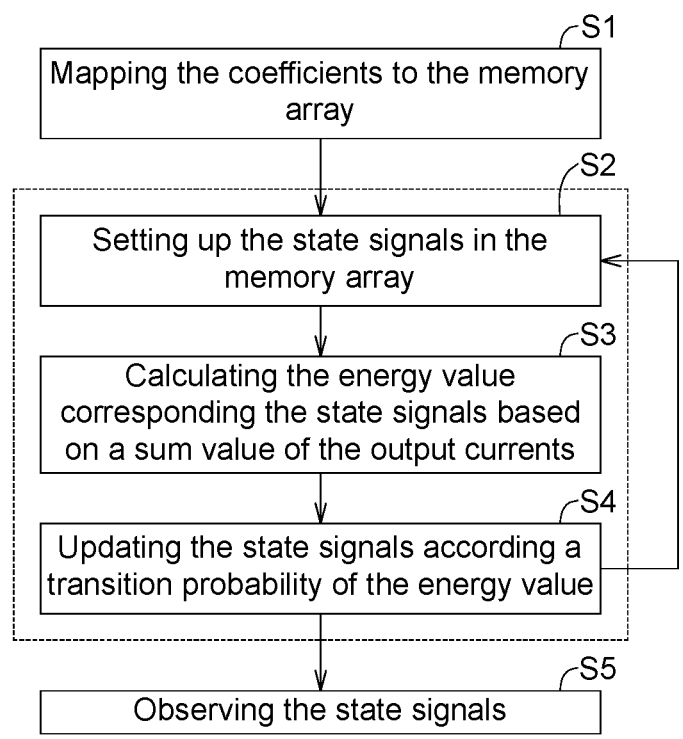
FIG. 12 illustrates a computing method according to the disclosure.

FIG. 12 illustrates the flow chart of an exemplary computing method according to the disclosure.

In step S1, the coefficients are mapped to the memory array. According to some embodiments, the computation may be focused on the interaction term of the energy. As such, the coefficients are interaction coefficients between sites. Exemplary interaction coefficient $J_{12}$, $J_{13}$, $J_{1N}$, $J_{21}$, $J_{23}$, $J_{2N}$, $J_{31}$, $J_{32}$, $J_{3N}$, $J_{N1}$, $J_{N2}$, and $J_{N3}$ are shown in FIG. 3 at corresponding memory elements M. As shown in FIG. 3, the computation may be conducted by the memory elements that are not arranged at a diagonal of the memory array. For example, the two memory cells of each of the memory elements that is not arranged at a diagonal of the memory array may perform a logic "XNOR" operation. In some embodiments, the computation may further comprise the external field term of the energy. The coefficients to be mapped comprise interaction coefficients and the self coefficients. Exemplary self coefficient $h_1$, $h_2$, $h_3$, and $h_N$ are shown in FIG. 3 at corresponding memory elements M. As shown in FIG. 3, the computation of external field term may be conducted by the memory elements that are arranged at a diagonal of the memory array, and the memory cells thereof may perform a logic "AND" operation. The step S1 may be achieved by tuning threshold voltages or resistances of the two memory cells of each of the memory elements.

In step S2, the state signals are set up in the memory array. For example, a $m^{th}$ configuration of the state signals may be set up into the memory array, wherein m is a positive integer. The state signals may correspond to spins of the sites selected from +1 and −1. The step S2 comprises: conducting a complementary read operation for individually selecting one of the two memory cells of each of the memory elements for receiving two corresponding state signals; and inputting the state signals into the selected memory cells of the memory elements, wherein the selected memory cells generates a plurality of output currents. According to some embodiments, the complementary read operation may comprise flipping a corresponding state signal, as shown in FIG. 11, if a trigger condition is met. Generally, the flipping will not affect the calculation result of a memory element. However, if one of the memory cells in the memory element is damaged, the flipping is beneficial for preventing a wrong coupling result. The trigger condition may be represented by formula (5).

$$R\in[0,1]>U \quad (5)$$

In formula (5), R is a given random value, and U is a threshold value. In some embodiments, U may be 0.5.

In step S3, the energy value corresponding to the state signals is calculated based on a sum value of the output currents. More specifically, the energy value corresponding to the $m^{th}$ configuration of the state signals may be calculated. When the sum value of the output current is the output current of a string, such as the output current $L_1$, $L_2$, $L_3$, or $L_4$ as shown in FIG. 3, the energy value corresponds to a local minimum energy. When the sum value of the output current is the output current of the whole memory array, i.e., the total of output currents of all strings, the energy value corresponds to a global minimum energy.

In step S4, the state signals are updated according a transition probability of the energy value. More specifically, if the transition probability is larger than a predefined value, a new $(m+1)^{th}$ configuration of the state signals will replace the original $m^{th}$ configuration of the state signals. In some embodiments, the transition probability P may be represented by formula (6).

$$P = Sigmoid\left(\frac{2(-Li - qi)}{T}\right) \quad (6)$$

In formula (6), $L_i$ is local spin energy, and $q_i$ and T are hyper-parameters.

The steps S2-S4 may be repeated until a predetermined finish condition is met. After end of repetition, step S5 may be conducted. In step S5, the state signals may be observed. In other words, the final configuration of the state signals, which corresponds to the optimal solution, may be observed.

Figure 13:
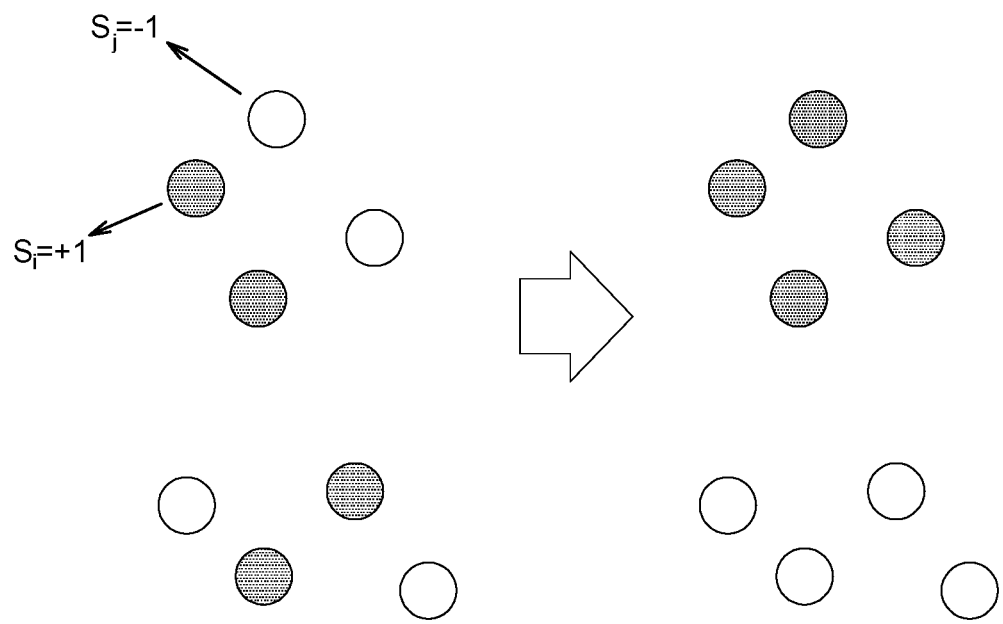
FIG. 13 illustrates an application of a computing method according to the disclosure.

The computing method according to the disclosure may applying quantum annealing algorithm employing Ising model. In particular, the computing method according to the disclosure may applying quantum annealing algorithm employing Ising model without an external field term. For example, the computing method according to the disclosure may be applied in a combinatorial clustering problem of machine learning as shown in FIG. 13 represented by formula (7).

$$H=\Sigma_{i,j=1}^{N}d(x_i,x_j)s_is_j \quad (7)$$

In formula (7), d is the distance. When d is large, state signals $s_i$ and $s_j$ tend to adopt opposite spins. When d is small, state signals $s_i$ and $s_j$ tend to adopt the same spin.

Figure 14:
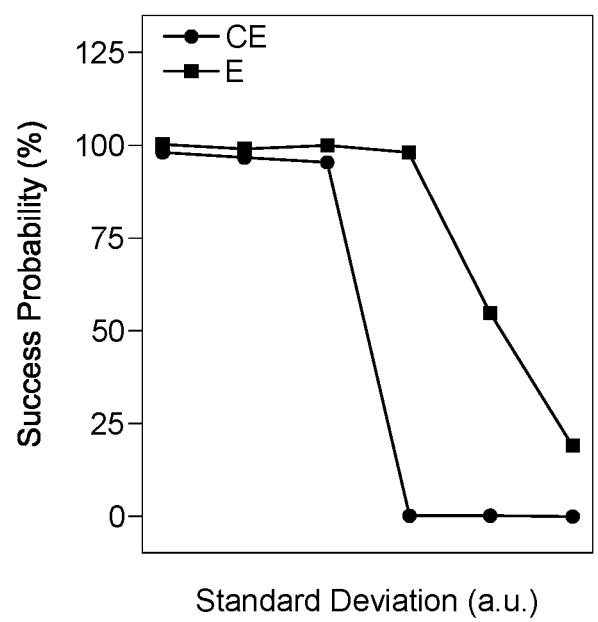
FIG. 14 illustrates an advantage of a computing method according to the disclosure.

The computing method according to the disclosure allows for higher tolerance on the variation of threshold voltage in cases that the threshold voltage is tuned for setting the coefficients, such as the cases using the memory elements as shown in FIGS. 4-5. The threshold voltage typically has a distribution pattern with a standard deviation. Referring to FIG. 14, compared to a comparative example CE without the complementary read operation, an example E using the complementary read operation of the disclosure can increase the acceptable variation of threshold voltage by up to 60%. Similarly, the computing method according to the disclosure allows for higher tolerance on the variation of resistance in cases that the resistance is tuned for setting the coefficients, such as the cases using the memory elements as shown in FIGS. 6-9.

Based on the above, the disclosure provides a memory device and a computing method using the same as improved implementations for algorithms.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
    a memory array of a plurality of memory elements, each of the memory elements comprising two memory cells;
    a plurality of word lines or a plurality of word line pairs connected to rows of the memory array;
    a plurality of bit line pairs connected to columns of the memory array; and
    a plurality of common source lines connected to the columns of the memory array;
    wherein the memory device is configured for calculating an energy value based on a plurality of state signals and a plurality of coefficients, and the two memory cells of each of the memory elements are configured for performing an individual selection such that one of the two memory cells of each of the memory elements receives two corresponding state signals from a corresponding word line or a corresponding word line pair and a corresponding bit line pair and generates an output current into a corresponding common source line for calculating the energy value.

2. The memory device according to claim 1, wherein the two memory cells of each of the memory elements that is not arranged at a diagonal of the memory array perform a logic "XNOR" operation.

3. The memory device according to claim 1, wherein each of the memory cells has a tunable threshold voltage or a tunable resistance.

4. The memory device according to claim 1, wherein each of the memory cells comprises a transistor.

5. The memory device according to claim 1, wherein each of the memory cells comprises a transistor and a resistor.

6. The memory device according to claim 1, wherein each of the memory elements comprise two transistors of same type or two transistors of complementary type.

7. The memory device according to claim 1, wherein each of the memory cells is a floating gate cell, a charge trapping cells, or a FeFET cell.

8. The memory device according to claim 1, wherein each of the memory cells is a ReRAM cell, a CBRAM cell, a PCM cell, or a MRAM cell.

9. The memory device according to claim 1, wherein one of the two memory cells of each of the memory elements is coupled to the corresponding word line or a word line of the corresponding word line pair, a bit line of the corresponding bit line pair, and the corresponding common source line, and the other one of the two memory cells of each of the memory elements is coupled to the corresponding word line or the other word line of the corresponding word line pair, the other bit line of the corresponding bit line pair, and the corresponding common source line.

10. A computing method, wherein the computing method calculates an energy value based on a plurality of state signals and a plurality of coefficients, wherein the computing method uses a memory device, the memory device comprises a memory array of a plurality of memory elements, and each of the memory elements comprises two memory cells, and wherein the computing method comprises:
    setting up the state signals in the memory array, comprising:
        conducting a complementary read operation for individually selecting one of the two memory cells of each of the memory elements for receiving two corresponding state signals; and
        inputting the state signals into the selected memory cells of the memory elements, wherein the selected memory cells generates a plurality of output currents; and
    calculating the energy value corresponding to the state signals based on a sum value of the output currents.

11. The computing method according to claim 10, wherein the complementary read operation comprises flipping a corresponding state signal if a trigger condition is met.

12. The computing method according to claim 11, wherein the trigger condition is represented by:

$$R \in [0,1] > U,$$

wherein R is a given random value, and U is a threshold value.

13. The computing method according to claim 12, wherein U is 0.5.

14. The computing method according to claim 10, further comprising:
    before said setting up the state signals, mapping the coefficients to the memory array.

15. The computing method according to claim 14, wherein said mapping the coefficients is achieved by tuning threshold voltages or resistances of the two memory cells of each of the memory elements.

16. The computing method according to claim 10, further comprising:
    after said calculating the energy value corresponding to the state signals, updating the state signals according a transition probability of the energy value.

17. The computing method according to claim 16, wherein said setting up the state signals, said calculating the energy value corresponding to the state signals, and said updating the state signals are repeated until a predetermined finish condition is met, and the computing method further comprises:
    after end of repetition, observing the state signals.

18. The computing method according to claim 10, applying quantum annealing algorithm employing Ising model without an external field term.

19. The computing method according to claim 10, wherein the state signals correspond to spins of sites selected from +1 and −1, and the coefficients are interaction coefficients between the sites.

20. The computing method according to claim 10, wherein the two memory cells of each of the memory elements that is not arranged at a diagonal of the memory array perform a logic "XNOR" operation.

* * * * *